(12) United States Patent
Shaohua (10) Patent No.: US 9,362,890 B2
(45) Date of Patent: Jun. 7, 2016

(54) COMPENSATION FILTER FOR CASCADED-INTEGRATOR-COMB DECIMATOR

(71) Applicant: Hong Kong Applied Science and Technology Research Institute Co., Ltd., Shatin, New Territories (HK)

(72) Inventor: Zhao Shaohua, Tuen Mun (HK)

(73) Assignee: Hong Kong Applied Science and Technology Research Institute Co. Ltd., Shatin (HK)

( * ) Notice: Subject to any disclaimer, the term of this patent is extended or adjusted under 35 U.S.C. 154(b) by 267 days.

(21) Appl. No.: 14/276,892

(22) Filed: May 13, 2014

(65) Prior Publication Data

US 2015/0333732 A1   Nov. 19, 2015

(51) Int. Cl.
*G06F 17/17*   (2006.01)
*H03H 17/06*   (2006.01)
*H03H 17/02*   (2006.01)
*H03H 17/00*   (2006.01)

(52) U.S. Cl.
CPC ....... *H03H 17/0671* (2013.01); *H03H 17/0251* (2013.01); *H03H 2017/0072* (2013.01)

(58) Field of Classification Search
CPC .................. H03H 17/0671; H03H 17/0251
USPC ......................................................... 708/313
See application file for complete search history.

(56) References Cited

U.S. PATENT DOCUMENTS

| | | | |
|---|---|---|---|
| 6,279,019 B1 | 8/2001 | Oh et al. | |
| 6,311,201 B1 * | 10/2001 | Albright | ............ H03H 17/0288 |
| | | | 708/313 |
| 6,993,464 B2 | 1/2006 | Chiu et al. | |
| 7,035,888 B2 | 4/2006 | Lee | |
| 8,386,971 B2 * | 2/2013 | Mansour | ................ H03H 17/00 |
| | | | 716/100 |

OTHER PUBLICATIONS

Altera, "Understanding CIC Compensation Filters," Altera Corporation AN-455-1.0, Apr. 2007, ver. 1.0, Application Note 455, pp. 1-17.

* cited by examiner

*Primary Examiner* — Tan V. Mai
(74) *Attorney, Agent, or Firm* — Norton Rose Fulbright US LLP (57) ABSTRACT

The present invention is directed to systems and methods which provide an improved compensation filter, as may be used with respect to a decimator, optimally designed using a convex optimization approach. Compensation filters of embodiments of the invention may, for example, be used with respect to a CIC decimator. In accordance with embodiments of the invention, compensation filters are designed with minimum order to approximate target frequency response in the target frequency bands. Additionally or alternatively, compensation filters of embodiments are optimally designed for passband drop and stopband attenuation improvement, such as to satisfy the specified peak ripple in the passband and/or to satisfy the specified peak errors over a set of target sub-bands in the stopband.

24 Claims, 9 Drawing Sheets

COMPENSATION FILTER FOR CASCADED-INTEGRATOR-COMB DECIMATOR

TECHNICAL FIELD

The invention relates to communication signal processing and, more particularly, to design of compensation filters, such as for use with respect to cascaded-integrator-comb decimators, using convex optimization techniques.

BACKGROUND OF THE INVENTION

The use of communication systems in both personal and business day-to-day tasks has become nearly ubiquitous. Both wireline communications networks and wireless communications networks, including the public switched telephone network (PSTN), the Internet, cellular networks, cable transmission systems, local area networks (LANs), metropolitan area networks (MANs), and wide area networks (WANs), are pervasively deployed in modern society and facilitate communication of voice, data, multimedia, etc.

In operation, the communication systems providing such communications implement various signal processing techniques, such as to up-convert and/or down-convert signals between baseband frequencies and carrier and/or intermediate frequencies, to modulate and/or demodulate the signals, to provide filtering and shaping of signals, to provide interference cancellation and/or mitigation, etc. Often, continuous signal sampling is implemented, such as for analog to digital conversion. Such continuous signal sampling is frequently required to be sampled with a sampling frequency significantly higher than the Nyquist frequency (i.e., oversampling). The oversampled signals are typically down-sampled to a lower frequency for the further processing in baseband. For example, a decimator module may be utilized to implement down-sampling of an oversampled signal to provide a baseband signal for further processing by other modules of a particular communication system.

Figure 1A:
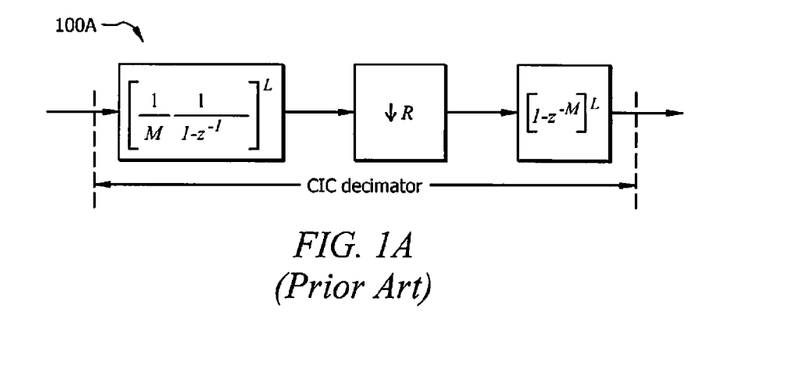
FIG. 1A shows a block diagram of a CIC decimator implemented as a L-stage CIC filter in accordance with the prior art.

Due to its relative simplicity, a Cascaded-Integrator-Comb (CIC) decimator is one of the most common decimators used with respect to down-sampling oversampled signals. In general, a CIC decimator is comprised of one or more integrator and comb filter pairs. In providing decimation of the oversampled single, the input signal is fed through one or more cascaded integrators, a down-sampler, and one or more comb sections (equal in number to the number of integrators). FIG. 1A shows a block diagram of CIC decimator 100A implemented as a L-stage CIC filter with differential delay M and decimator factor R. The frequency response of such a CIC filter may be represented as $$H_{CIC}(e^{j\omega}) = \left[\frac{1 - e^{-j\omega RM}}{1 - e^{-j\omega}}\right]^L,$$

where R is the decimation ratio, M is the number of samples per stage, L is the number of stages in the filter. As can be appreciated from the diagram of FIG. 1A, digital implementation of CIC filters requires only additions and subtractions, which dramatically reduces the power consumption and hardware resource requirements as compared to other decimators.

Figure 1B:
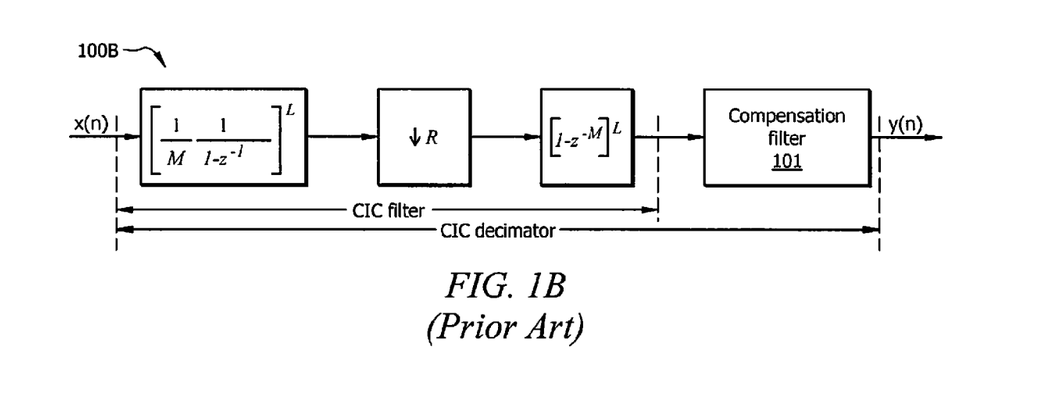
FIG. 1B shows a block diagram of a CIC decimator including a compensation filter coupled to the output of the CIC filter thereof to provide some level of linear phase filtering in accordance with the prior art.
Figure 2A:
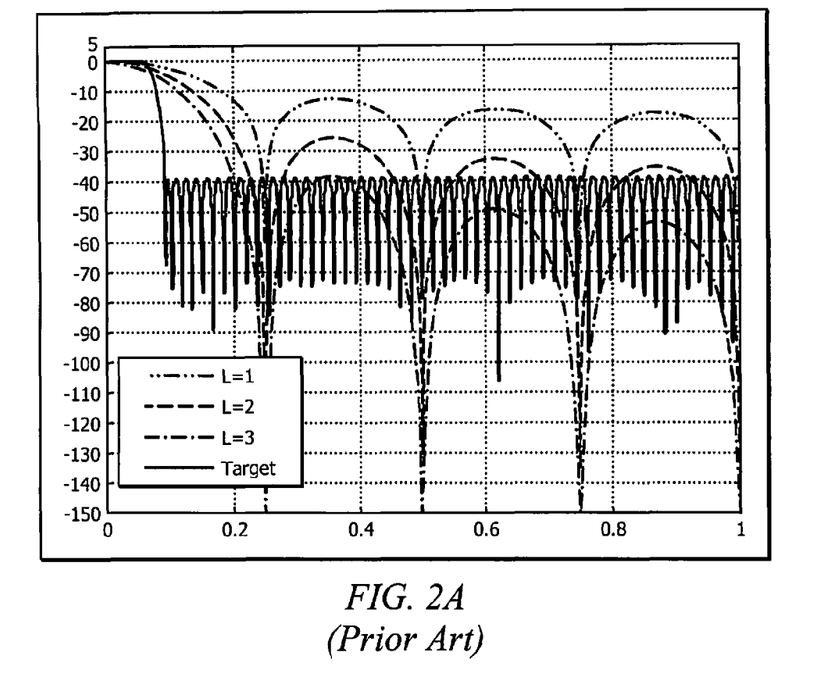
FIG. 2A illustrates the magnitude response of CIC decimators of the prior art.
Figure 2B:
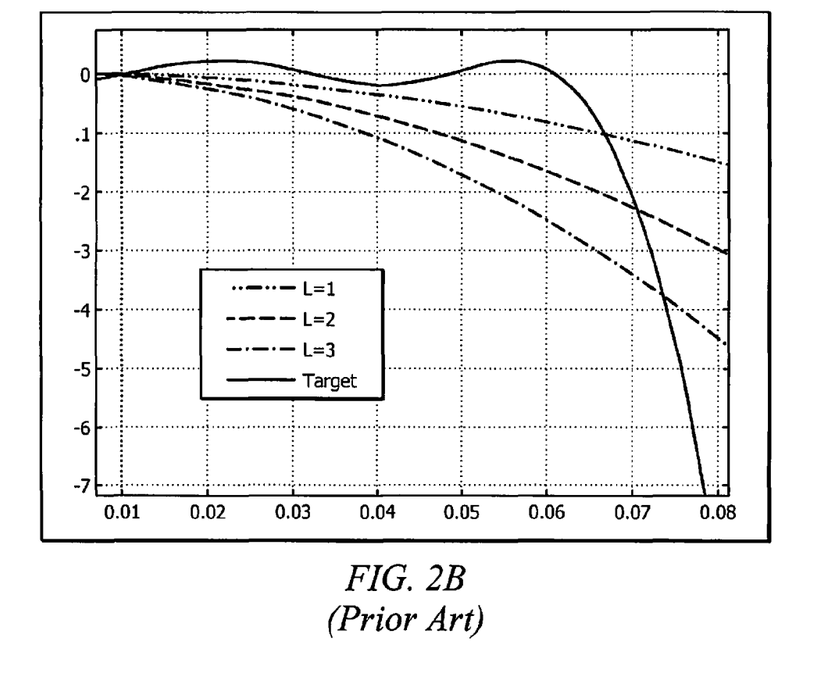
FIG. 2B illustrates a magnified view of the passband of the CIC decimators of FIG. 2A.

FIGS. 2A and 2B illustrate the magnitude response of CIC decimators having different stages. Specifically, FIG. 2A generally illustrates the magnitude response of CIC decimators while FIG. 2B provides a magnified view of the passband of the CIC decimators. As can be appreciated from the graphs of FIG. 2A, the CIC filter exhibits a high passband drop and low stopband attenuation. Although the stopband attenuation can be increased with an increase in the number of stages, the drop in passband correspondingly becomes worse, which is not acceptable in many applications. From FIGS. 2A and 2B it is clear that, to obtain the target frequency response, extra linear phase filtering is necessary to compensate for the passband drop and to improve stopband attenuation. Accordingly, CIC decimator 100B shown in FIG. 1B includes compensation filter 101 coupled to the output of the CIC filter thereof to provide some level of linear phase filtering.

Several prior attempts have been made at addressing the design of the foregoing compensation filter. Some such attempts, however, only considered the passband drop. For example, the compensation filter design provided in U.S. Pat. No. 6,279,019 employs interpolated second-order polynomials to compensate for the passband drop, wherein the stopband attenuation is not improved or even made worse. Likewise, some prior attempts only consider the stopband attenuation. For example, the compensation filter design provided in U.S. Pat. No. 6,993,464 employs a Finite Impulse Response (FIR) filter design for spectral shaping by window methods to increase the stopband attenuation, wherein the passband drop is not improved or even made worse. Although some prior attempts have considered both the passband drop and stopband attenuation, such attempts have nevertheless provided undesirable implementations. For example, the compensation filter design provided in U.S. Pat. No. 7,035,888 employs a high order sharpening polynomial, wherein the wider the passband and the larger the stopband attenuation, the higher the order of the polynomial. Implementation using such higher order polynomials inevitably require multipliers, thus resulting in a relatively complex and resource costly solution. In "Understanding CIC Compensation Filters", Altera, Application Note 455, April 2007, passband and stopband improvement is based on FIR filters. However, the frequency characteristic of CIC filter is not fully utilized during compensation filter design.

BRIEF SUMMARY OF THE INVENTION

The present invention is directed to systems and methods which provide an improved compensation filter, as may be used with respect to a decimator, optimally designed using a convex optimization approach. Compensation filters of embodiments of the invention may, for example, be used with respect to a CIC decimator. In accordance with embodiments of the invention, compensation filters are designed with minimum order to approximate a target frequency response in the target frequency bands. Additionally or alternatively, compensation filters of embodiments are optimally designed for passband drop and stopband attenuation improvement, such as to satisfy the specified peak ripple in the passband and/or to satisfy the specified peak errors over a set of target sub-bands in the stopband.

An embodiment of the present invention provides a method to optimally design a compensation filter for a CIC decimator (comprising a CIC filter and the compensation filter), and having passband drop and stopband attenuation improvement. The method includes receiving an input specification, wherein the input specification includes one or more of the order of the CIC filter, a differentia delay (M) of the CIC filter, a decimation factor (R), a passband frequency, a stopband frequency, peak passband ripple, and peak stopband error. The method of embodiments further includes discretizing a frequency variable ($\omega$) over a dense set of frequencies ($\{\omega_i$, $1 \leq i \leq K_1\}$) on the passband frequency and stopband frequency, and calculating the frequency response of the CIC filter over the discretized frequencies. The method may further include, formulating an approximation error in minimax or Least Squares (LS) criteria to Second-Order Cone Programming (SOCP) over the discretized frequencies, formulating the peak stopband error to a set of second-order cones over a set of target sub-bands in the stopband, formulating the peak passband ripple to a set of second-order cones over a set of target sub-bands in the passband, and solving the SOCP for design the coefficients of the compensation filter.

In accordance with embodiments of the invention, formulating an approximation error in minimax or LS criteria to SOCP over the discretized frequencies for designing a compensation filter includes one or more calculations utilizing the discretized frequency points. For example, embodiments include calculating the target frequency response at the discretized frequency points, calculating the frequency response of the CIC filter at the discretized frequency points, calculating the frequency response of the compensation filter at the discretized frequency points, calculating the frequency response of the CIC decimator based on the calculated frequency response of the CIC filter and the calculated frequency response of the compensation filter at the discretized frequency points, and calculating the approximation error between the calculated frequency response of the CIC decimator and the calculated target frequency response at the discretized frequency points. In operation according to embodiments, the minimization of the maximum estimation error may be formulated to a set of second-order cones according to minimax criteria at the discretized frequency points to one second-order cone. Alternatively, embodiments may formulate the minimization of integrated least square estimation error according to LS criteria over the discretized frequency points to one second-order cone.

In accordance with embodiments of the invention, formulating the peak stopband error to a set of second-order cones over a set of target sub-bands in the stopband includes one or more calculations using the discretized frequency points. For example, embodiments include calculating the target frequency response at the discretized frequency points, calculating the frequency response of CIC filter at the discretized frequency points, calculating the frequency response of the compensation filter at the discretized frequency points, and calculating the frequency response of the CIC filter combined with the compensation filter at the discretized frequency points. Embodiments further impose the peak stopband error for the i-th target sub-band in stopband to formulate a set of second-order cones. In operation according to embodiments, the foregoing calculating and imposing of the peak stopband error are repeated for all the specified target frequency bands for the peak stopband errors to be imposed.

In accordance with embodiments of the invention, formulating the peak passband ripple to a set of second-order cones over a set of target sub-bands in the passband includes one or more calculations using the discretized frequency points. For example, embodiments include calculating the target frequency response at the discretized frequency points, calculating the frequency response of the CIC filter at the discretized frequency points, calculating the frequency response of the compensation filter at the discretized frequency points, and calculating the frequency response of the CIC filter combined with the compensation filter at the discretized frequency points. Embodiments further impose the peak passband ripple for the p-th target sub-band in passband to formulate a set of second-order cones. In operation according to embodiments, the foregoing calculating and imposing of the peak passband ripple are repeated for all the specified target frequency bands for the peak passband ripple to be imposed.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 3:
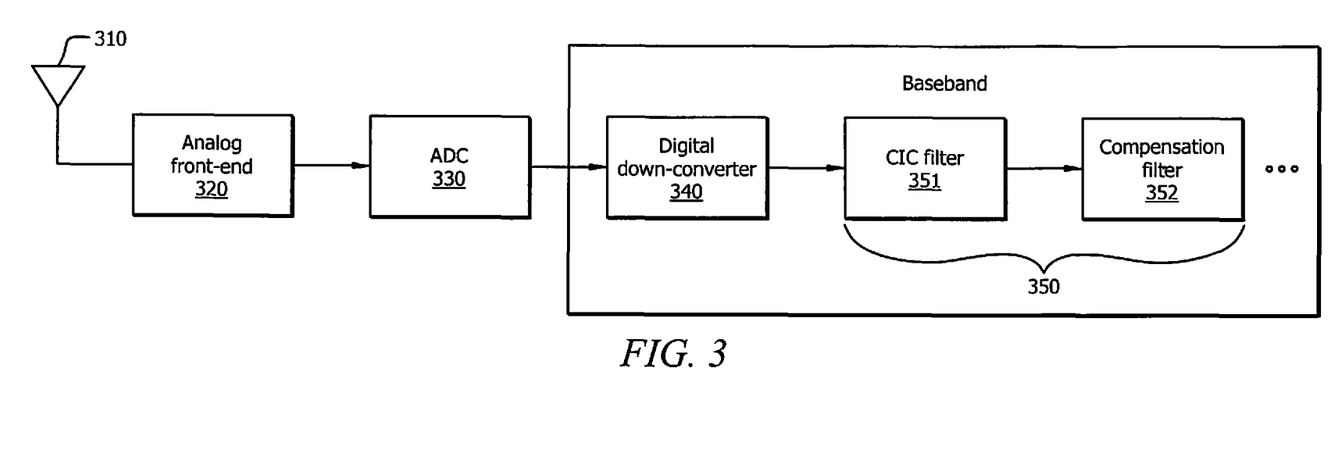
FIG. 3 shows a block diagram of a portion of a receiver including a CIC decimator having a compensation filter designed and adapted according to embodiments of the present invention.

FIG. 3 shows a block diagram of a portion of a receiver, as may be utilized in providing wireless communications, including a CIC decimator having a compensation filter designed and adapted according to the concepts of the present invention. In the illustrated embodiment, receiver portion 300 of FIG. 3 includes antenna 310, analog front-end 320, Analog to Digital Converter (ADC) 330, digital down-converter 340, and Cascaded-Integrator-Comb (CIC) decimator 350, wherein CIC decimator 350 includes CIC filter 351 and compensation filter 352. Antenna 310 may operate to receive radio frequency (RF) communication signals and pass those signals to analog front-end 320 for processing. Analog front-end 320 may provide signal processing such as filtering (e.g., low pass filtering, high pass filtering, or band pass filtering) to remove or attenuate unwanted signals, amplification to increase the received signal strength, etc. in order to provide a signal suitable for further processing by modules of receiver portion 300. ADC 330 of receiver portion 300 provides conversion of the analog signals as received to digital signals for further processing. ADC 330 implements oversampling to improve resolution of the resulting digital signal. For example, ADC 330 may operate to provide an 8× oversampling ratio (OSR) to enable the use of a 1-bit ADC instead of a multiple bit ADC. Such a 1-bit ADC does not need certain circuits in analog front-end required by the multiple bit ADC (e.g., real time receive signal strength indicator (RSSI), auto gain control, and variable power amplifier), thereby reducing the power consumption and hardware resources of the receiver. CIC decimator 350 is coupled to the output of digital down-converter 340 and is operable to down-sample the signal for further processing. For example, CIC decimator 350 of embodiments may operate to down-sample the signal by a factor of 4. Further processing of the signal provided by additional modules (not shown) of the receiver may comprise, for example, further signal filtering, signal combining, data packet unwrapping, data decoding, data error correction and/or recovery, data assembly, etc.

Figure 4A:
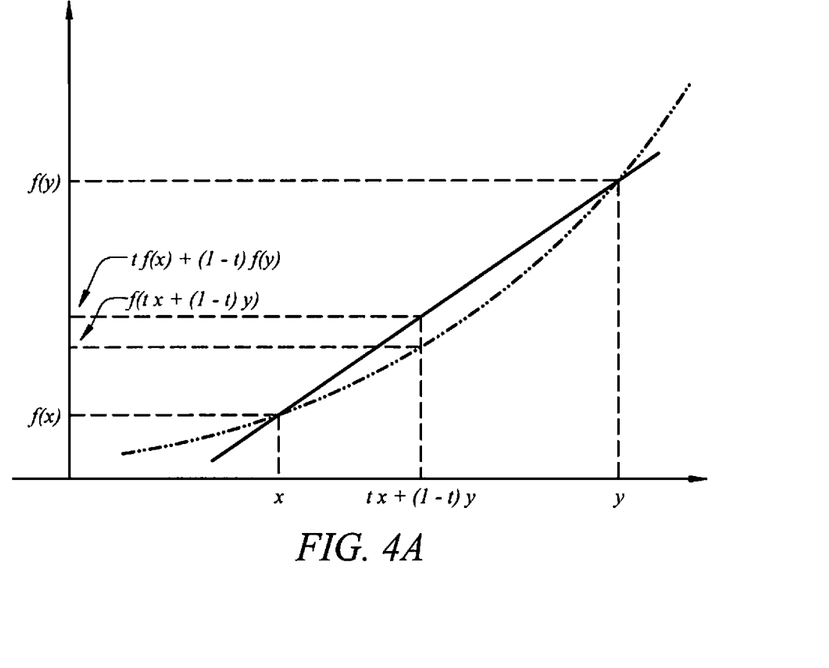
FIG. 4A shows a graph illustrating convex optimization resolving the problem of minimizing a convex function over a convex set.

Compensation filter 352 of embodiments is designed using convex optimization techniques. Convex optimization is a sub-field of optimization, resolving the problem of minimizing a convex function over a convex set, as shown in the graph of FIG. 4A. That is, minimize $f_0(x)$ subject to $f_i(x) \leq b_i$, $i=1, \ldots, m$, where $f_0, \ldots, f_m$ are convex (i.e., satisfying $f_i(tx+(1-t)y) \leq tf_i(x)+(1-t)f_i(y)$ for $x, y \in R^n$, $t \in R$, and $t \geq 0$). Advantages of utilizing convex optimization according to the concepts herein include convex optimization can be solved reliably and efficiently, global optimal solution is guaranteed, and multiple design objectives (e.g., linear and convex constraints) can be satisfied.

Figure 4B:
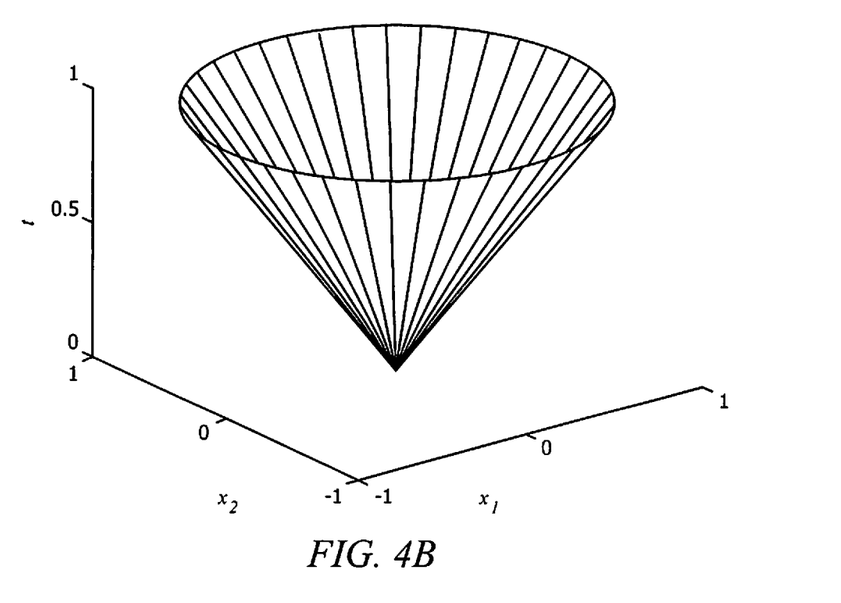
FIG. 4B shows a graph illustrating a second-order cone of SOCP for resolving the problem of minimizing a convex function over a complex set.

SOCP comprises a special case of convex quadratic programming for resolving the problem of minimizing a convex function over a complex set. FIG. 4B shows a graph of a second-order cone for $\|x\|_2 \leq t$. SOCP provides minimizing $f^T x$ subject to $\|A_i x + b_i\|_2 \leq c_i^T x + d_i$, $i=1, \ldots, m$ and $Fx=g$.

Embodiments of the invention provide for designing a compensation filter with minimum order to approximate the target frequency response in the target frequency bands by formulating these attributes of the compensation filter as a SOCP. Additionally, embodiments of the invention provide for satisfying the specified peak ripple in the passband (e.g., 0.2 dB of target frequency response) by formulating these attributes as a set of linear constraints added to the foregoing SOCP. Embodiments of the invention further provide for satisfying specified peak errors over a set of target sub-bands in the stopband (e.g., −35 dB of target frequency) by formulating these attributes as a set of convex quadratic constraints added to the foregoing SOCP. Accordingly, such embodiments formulate the design target to SOCP, where the global optimal solution, if it exists, can be found. It should be appreciated that such embodiments may be utilized to jointly improve both the passband and the stopband of the CIC decimator. Moreover, the frequency characteristic of CIC filter may be fully utilized. The foregoing embodiments facilitate design flexibility by setting different attenuation requirements on the sub-bands of interest within the stopband and different peak ripple requirements on the sub-bands of interest within the passband. Minimizing order of the compensation filter while meeting the specified design targets as provided by the foregoing embodiments provides for reduced hardware resources and power consumption, which is critical for low cost and low power systems.

Embodiments of the present invention operate to determine the coefficients of compensation filter 352 so that CIC decimator 350 can approximate the target frequency response. Compensation filter 352 may, for example, be designed is a N-tap FIR filter with the frequency response $H_{Comp}(\omega) = \sum_{n=0}^{N-1} h(n) e^{-jn\omega}$. The frequency response of CIC filter 351 is known and denoted by $H_{CIC}(\omega)$. Thus, the frequency response of CIC decimator 350 can be written as $H_s(\omega) = H_{CIC}(\omega) \cdot H_{Comp}(\omega)$. It should be appreciated that the target frequency response can have arbitrary features, depending upon the particular circumstances. To aid in understanding the concepts herein, an exemplary target frequency response is assumed to have a low-pass feature defined by $$H_d(\omega) = \begin{cases} e^{j\omega D}, & 0 \leq \omega \leq \omega_p \\ 0, & \omega_s \leq \omega \leq 1 \end{cases},$$

where D is the overall group delay, $\omega_p$ is the passband, and $\omega_s$ is the stopband. From the foregoing, it can be appreciated that the approximation error between CIC decimator 350 and the target frequency response may be represented by $e(\omega) = H_s(\omega) - H_d(\omega)$.

In determining the coefficients of compensation filter 352 according to embodiments, the target response is approximated in the minimax criterion. Approximating the target response in the minimax criterion provides $$\underset{h(n)}{\text{minimize}} \{\text{maximize}(W(\omega)|e(\omega)|)\},$$

$\omega \in \Omega_i$, where $W(\omega)$ is a positive weighting function and $\Omega_i \subset [-\pi, \pi]$ is the frequency band of interest comprising the passband and the stopband. The foregoing minimax approximation of the target response can be reformulated to a standard SOCP as below, which can be solved readily.

The standard SOCP reformulated from the minimax approximation of the target response may be represented as $$\min_x c^T x,$$

where, subject to $c^T x \geq \|F_i x - g_i\|_2$, $c = [1 \ O_N^T]^T$ and $x = [\delta \ h^T]^T$, where $O_N$ is a N row zero vector and $h = [h_0, h_1, \ldots, h_{N-1}]^T$, and where $$F_i = W(\omega_i)\begin{bmatrix} 0 & r(\omega_i)^T \\ 0 & i(\omega_i)^T \end{bmatrix},$$

$r(\omega_i)=H_{CIC\_R}(\omega_i)c(\omega_i)-H_{CIC\_I}(\omega_i)s(\omega_i)$, $g_i=W(\omega_i)[H_{R\_d}(\omega_i)\ H_{I\_d}(\omega_i)]^T$, and $i(\omega_i)=H_{CIC\_R}(\omega_i)s(\omega_i)+H_{CIC\_I}(\omega_i)c(\omega_i)$. Additionally, $H_{CIC\_R}(\omega_i)=\text{Re}[H_{CIC}(\omega_i)]$, $H_{CIC\_I}(\omega_i)=\text{Im}[H_{CIC}(\omega_i)]$, $H_{R\_d}(\omega_i)=\text{Re}[H_d(\omega_i)]=\cos(\omega_i D)$, $H_{I\_d}(\omega_i)=\text{Im}[H_d(\omega_i)]=\sin(\omega_i D)$, $c(\omega_i)=[1,\cos(\omega_i)\ldots,\cos((N-1)\omega_i)]^T$, and $s(\omega_i)=[0,\sin(\omega_i)\ldots,\sin((N-1)\omega_i)]^T$. Re(y) and Im(y) represent the real and imaginary part of y respectively.

As an alternative to the foregoing minimax criterion, embodiments of the present invention may utilize LS criterion in determining the coefficients of compensation filter 352. Approximating the target response in the LS criterion provides $$\underset{h}{\text{minimize}}\left(\int_{\Omega_l} W(\omega)|e(\omega)|^2 d\omega\right),$$

$\omega \in \Omega_i$, where $W(\omega)$ is a positive weighting function and $\Omega_i \subset [-\pi, \pi]$ is the frequency band of interest comprising the passband and the stopband. As with the minimax approximation described above, the foregoing LS approximation of the target response can be reformulated to a standard SOCP as below.

The standard SOCP reformulated from the LS approximation of the target response may be represented as $$\underset{x}{\text{min}}\, c^T x,$$

where, subject to $c^T x - \bar{k} \geq \|\bar{Q}x - \bar{p}\|$, $c = [1\ O_N^T]^T$ and $x = [\delta\ h^T]^T$, where $O_N$ is a N row zero vector and $h = [h_0, h_1, \ldots, h_{N-1}]^T$, and where $k = \int_{\Omega_i} W(\omega)|H_d(\omega)|^2 d\omega$, $\bar{Q} = [O_N\ Q^{-1/2}]$, and $\bar{p} = Q^{-1/2}p$. Additionally, $Q = \int_{\Omega_i} W(\omega)\cdot[r(\omega)r(\omega)^T + i(\omega)i(\omega)^T] d\omega$ and $p = \int_{\Omega_i} W(\omega)[r(\omega)H_{R\_d}(\omega) + i(\omega)H_{I\_d}(\omega)] d\omega$ As previously discussed, embodiments of the invention provide for satisfying specified peak errors over a set of target sub-bands in the stopband by formulating these attributes as constraints added to the foregoing SOCP. The peak stopband error constraints may be represented as $\omega \in [\omega_{l1}, \omega_{l2}]$ for the l-th target sub-band in the stopband and $\hat{\delta}_l$ for the maximally allowed error in the l-th target sub-band in the stopband. The targets can be formulated as a set of second-order cones as $$\|R_l x\|_2 \leq \hat{\delta}_l,\ R_l = \begin{bmatrix} 0 & r(\omega)^T \\ 0 & i(\omega)^T \end{bmatrix},\ \text{and}\ \omega \in [\omega_{l_1}, \omega_{l_2}],\ l = 1, \ldots, K_s,$$

which may readily be added to the foregoing SOCP $$\left(\text{i.e., } \underset{x}{\text{min}}\, c^T x\right)$$

as additional constraints.

Likewise, as previously discussed, embodiments of the invention provide for satisfying the specified peak ripple in the passband by formulating these attributes as constraints added to the foregoing SOCP. The peak passband ripple constraints may be represented as $\omega \in [\omega_{p1}, \omega_{p2}]$ for the p-th target sub-band in the passband and $\hat{\delta}_p$ for the maximally allowed ripple in the p-th target sub-band in the passband. The targets can be formulated as a set of second-order cones as $$\|R_p x - g_p\|_2 \leq \hat{\delta}_p,\ R_p = \begin{bmatrix} 0 & r(\omega)^T \\ 0 & i(\omega)^T \end{bmatrix},$$

$g_p = [H_{R\_d}(\omega)\ H_{I\_d}(\omega)]^T$, and $\omega \in [\omega_{p1}, \omega_{p2}]$, $p = 1, \ldots, K_p$, which may readily be added to the foregoing SOCP $$\left(\text{i.e., } \underset{x}{\text{min}}\, c^T x\right)$$

as additional constraints.

Figure 5:
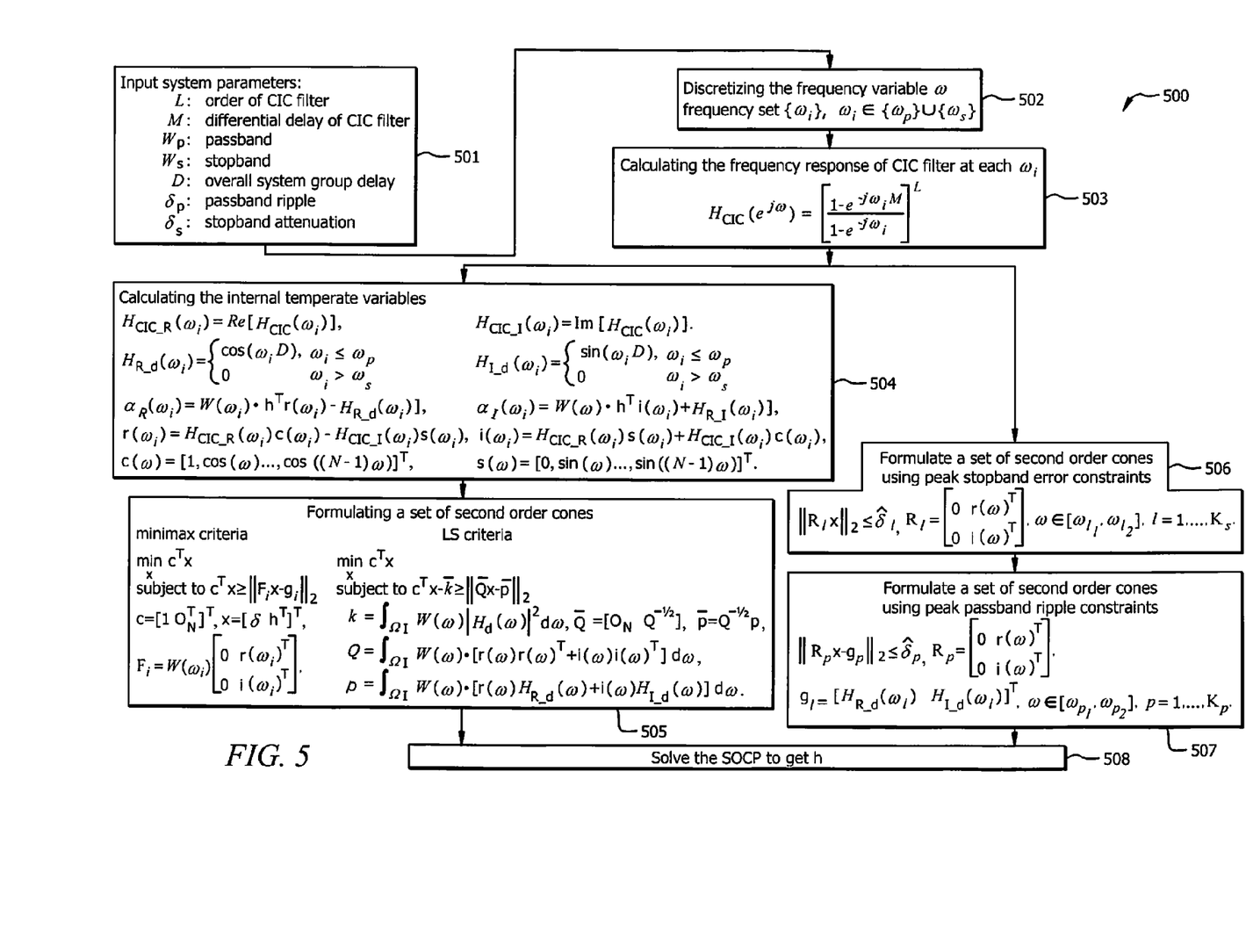
FIG. 5 shows a flow diagram implementing processes to determine the coefficients of a compensation filter through the use of SOCP and constraints in accordance with embodiments of the present invention.

FIG. 5 shows a flow diagram implementing processes according to embodiments herein to determine the coefficients of compensation filter 352 through the use of SOCP and constraints in accordance with the foregoing. It should be appreciated that the processes of flow 500 of FIG. 5 may be implemented as logic (e.g., compensation filter design logic 600 of FIG. 6). The logic may comprise a number of functional blocks, such as second-order cone modeling 601, constraints modeling 602, SOCP formulation 603, and SOCP solving 604, cooperative to provide processing in accordance with flow 500 for computing coefficients of compensation filter 352. Such logic may be executed or otherwise operable upon a processor-based system. For example, when implemented in software, elements of embodiments of the present invention are essentially code segments operable upon a computer system, such as computer system 900 of FIG. 9, to perform tasks as described herein. The program or code segments can be stored in a computer readable medium accessible by the computer system.

In operation according to the embodiment of flow 500 illustrated in FIG. 5, various system parameters are input at block 501 for use in determining compensation filter coefficients in accordance with the concepts herein. The system parameters input may, for example, include the number of stages in the CIC filter (L), the differential delay of the CIC filter (M), the passband ($W_P$), the stopband ($W_S$), the overall system group delay (D), the passband ripple ($\delta_P$), and the stopband attenuation ($\delta_S$).

At block 502 of the illustrated embodiment, the frequency variable ($\omega$) is discretized over a dense set of frequencies ($\{\omega_i, 1 \leq i \leq K_1\}$) on the passband frequency and stopband frequency. Discretizing the frequency variable ($\omega$) provides the frequency set $\{\omega_i\}$, $\omega \in \{\omega_{p1}\} \cup \{\omega_{p2}\}$.

The frequency response of CIC filter 351 is calculated at each of the discrete frequencies ($\omega_i$) at block 503 of the illustrated embodiment. For example, the frequency response of CIC filter 351 is known, as denoted by $H_{CIC}(\omega)$, and thus the frequency response of CIC filter 351 at each of the discrete frequencies may be calculated as $$H_{CIC}(e^{i\omega}) = \left[\frac{1 - e^{-i\omega_i M}}{1 - e^{-i\omega_i}}\right]^L.$$

The illustrated embodiment of the invention provides for designing compensation filter 352 with minimum order to approximate the target frequency response in the target frequency bands by formulating attributes of the compensation filter as a SOCP. Accordingly, at block 504 of the illustrated embodiment the internal temperate variables for the compensation filter attributes, such as for use with respect to the aforementioned minimax approximation of the target response and/or the LS approximation of the target response, are calculated. At block 505 of the illustrated embodiment, the compensation filter attributes are utilized with respect to the aforementioned minimax approximation of the target response and/or the LS approximation of the target response to formulate a set of second-order cones of a SOCP.

Embodiments of the invention further provide for satisfying specified peak errors over a set of target sub-bands in the stopband (e.g., −35 dB of target frequency) by formulating attributes of the compensation filter as a set of constraints for adding to the foregoing second-order cones. Accordingly, at block 506 of the illustrated embodiment, peak stopband error constraints are formulated as a set of second-order cones which may be added as additional constraints to the second-order cones formulated in block 505, as described above. Additionally, embodiments of the invention also provide for satisfying the specified peak ripple in the passband (e.g., 0.2 dB of target frequency response) by formulating attributes of the compensation filter as a set of constraints for adding to the foregoing second-order cones. Accordingly, at block 507 of the illustrated embodiment, peak passband ripple constraints are formulated as a set of second-order cones which may be added as additional constraints to the second-order cones formulated in block 505, as described above.

At block 508 of the illustrated embodiment, second-order cones having the constraints added thereto are solved to determine the set of filter parameters (h) for compensation filter 352, thereby providing for design of the compensation filter using a convex optimization approach. It can be appreciated from the foregoing that compensation filter 352 of the above embodiment is optimally designed for passband drop and stopband attenuation improvement and to satisfy the specified peak ripple in the passband and peak errors over a set of target sub-bands in the stopband. Moreover, compensation filter 352 of the above embodiments is designed with minimum order to approximate target frequency response in the target frequency bands.

Figure 7A:
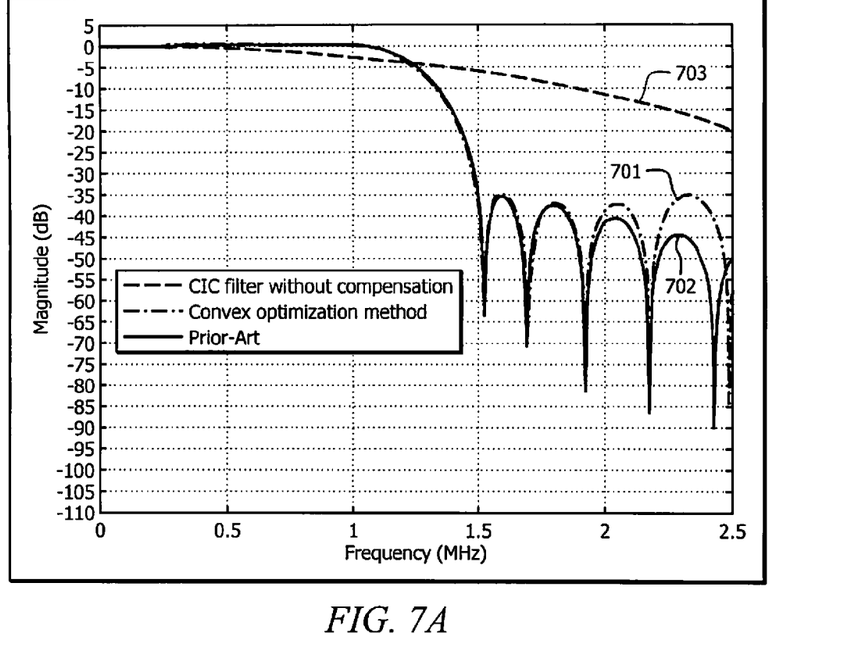
FIGS. 7A and 7B show a comparison of the frequency response of a CIC decimator designed using the processes of embodiments of the present invention to CIC decimators of the prior art.
Figure 7B:
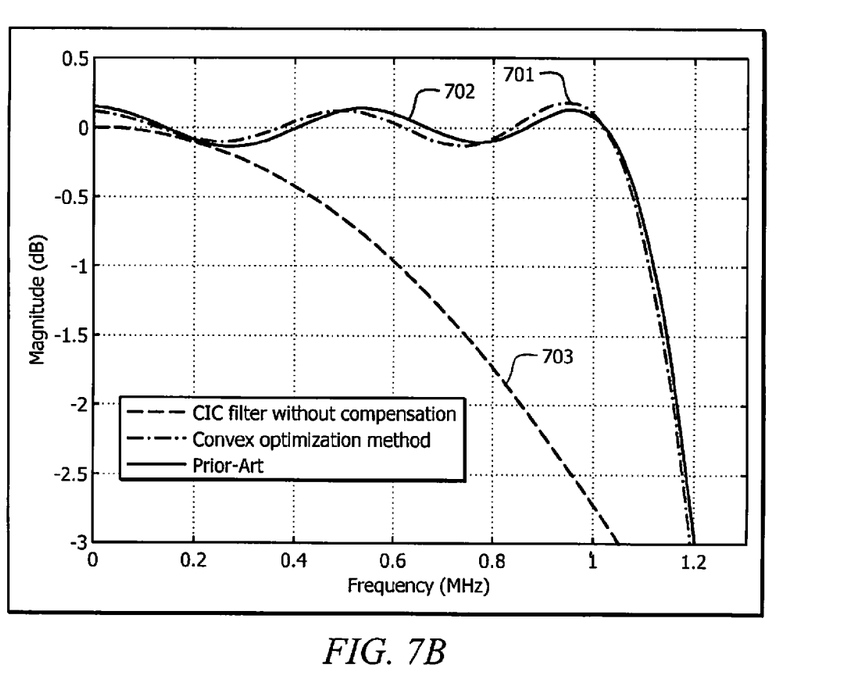

FIGS. 7A and 7B show a comparison of the frequency response of a CIC decimator designed using the processes of flow 500 described above as curve 701, the technique described in "Understanding CIC Compensation Filters", Altera, Application Note 455, April 2007 as curve 702, and a CIC decimator without compensation as curve 702. In particular, FIG. 7A shows the frequency response of the overall CIC decimators while FIG. 7B shows an enlarged view of the passband of the CIC decimators. The design targets for the CIC decimators of FIGS. 7A and 7B provide for a CIC decimator having 3 stages (L=3), differential delay of 8 (M=8), a decimation factor of 4 (R=4), sampling frequency of 32 MHz, passband of 0~1 MHz, stopband of 1.5 MHz~4 MHz, passband ripple of 0.2 dB, and stopband attenuation of −35 dB. The simulation results for the inventive compensation filter and the prior art filter according to this design example are:

| Method | Filter Order | Hardware Resources (16-bit word length) |
|---|---|---|
| Convex Optimization | 28 | 93 shifters, 121 adders |
| Prior-Art | 32 | 108 shifters, 140 adders |

As can be seen from the curves of FIGS. 7A and 7B, the decimator using the compensation filter optimized according to the techniques herein (curve 701) provides significantly better performance than the CIC filter without compensation (curve 703) and measurably better performance than that of the prior art technique (curve 702). Moreover, the compensation filter provided according to the concepts herein results in a hardware resource reduction of approximately 14% over that of the prior art technique (i.e., the inventive compensation filter provides for a filter order of 28 implementing 93 shifters and 121 adders (assuming 16-bit word lengths), while the prior art compensation filter provides for a filter order of 32 implementing 108 shifters and 140 adders (also assuming 16-bit word lengths).

Figure 8A:
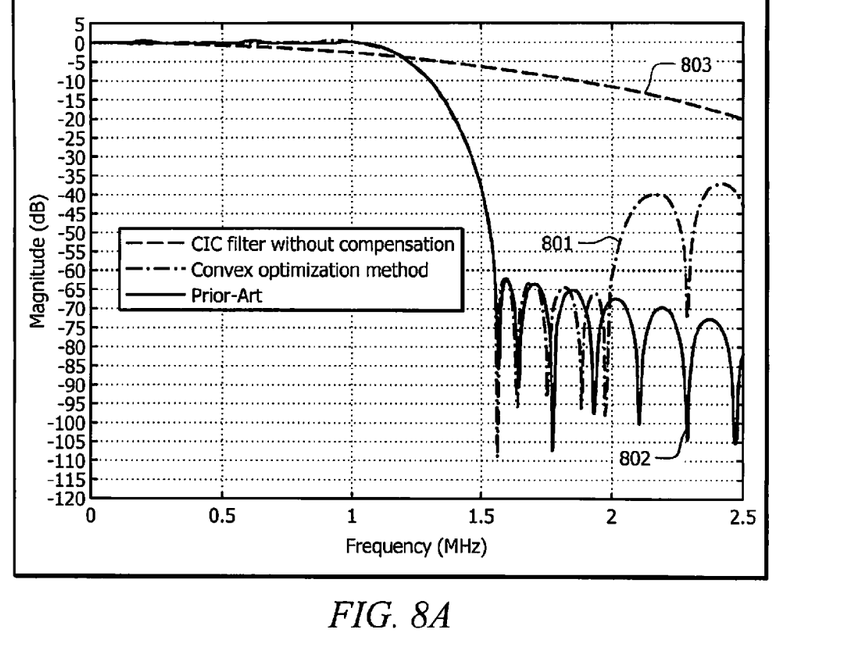
FIGS. 8A and 8B show a comparison of the frequency response of a CIC decimator designed using the processes of embodiments of the present invention to CIC decimators of the prior art.
Figure 8B:
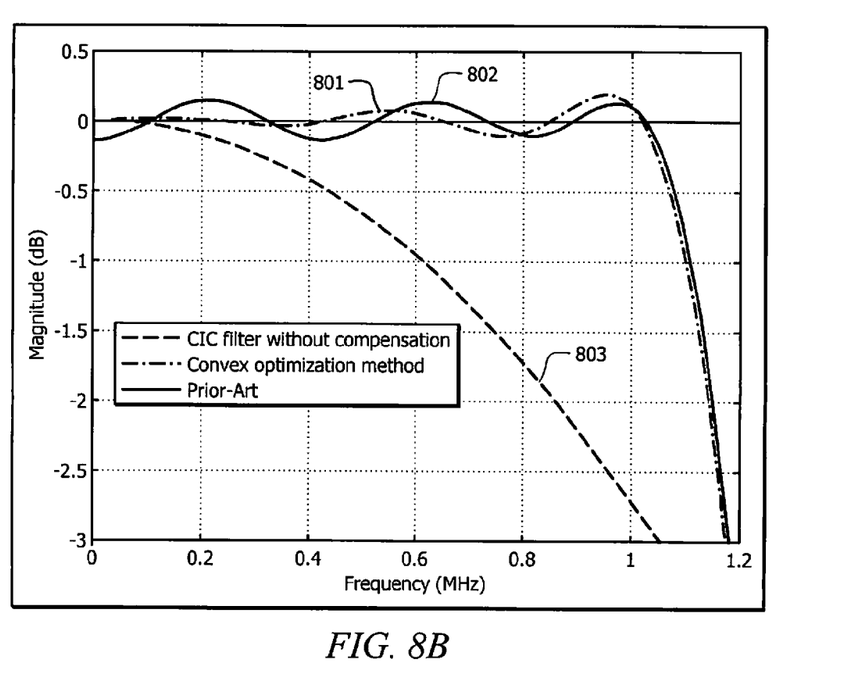

FIGS. 8A and 8B also show a comparison of the frequency response of a CIC decimator designed using the processes of flow 500 described above as curve 801, the technique described in "Understanding CIC Compensation Filters", Altera, Application Note 455, April 2007 as curve 802, and a CIC decimator without compensation as curve 802. As with FIGS. 7A and 7B above, FIG. 8A shows the frequency response of the overall CIC decimators while FIG. 8B shows an enlarged view of the passband of the CIC decimators. The design targets for the CIC decimators of FIGS. 8A and 8B remain the same as those of FIGS. 7A and 7B except that the CIC decimators of FIGS. 8A and 8B are subject to a strong narrowband interference from adjacent channel with 20 dB larger than the desired signal at frequency band 1.6 MHz~2 MHz. The simulation results for the inventive compensation filter and the prior art filter according to this design example are:

| Method | Filter Order | Hardware Resources (16-bit word length) |
|---|---|---|
| Convex Optimization | 34 | 113 shifters, 147 adders |
| Prior-Art | 42 | 142 shifters, 187 adders |

As can be seen from the curves of FIGS. 8A and 8B, the decimator using the compensation filter optimized according to the techniques herein (curve 801) again provides significantly better performance than the CIC filter without compensation (curve 803) and measurably better performance than that of the prior art technique (curve 802). Moreover, the compensation filter provided according to the concepts herein results in a hardware resource reduction of approximately 21% over that of the prior art technique (i.e., the inventive compensation filter provides for a filter order of 34 implementing 113 shifters and 147 adders (assuming 16-bit word lengths), while the prior art compensation filter provides for a filter order of 42 implementing 142 shifters and 187 adders (also assuming 16-bit word lengths).

As can be appreciated from the foregoing, embodiments of the present invention operate to jointly improve both passband and stop-band using a FIR compensation filter implementation by employing convex optimization techniques to find the optimal solution. Accordingly, in operation according to embodiments herein, multiple design objectives can readily be achieved. Moreover, the filter coefficients for a compensation filter designed in accordance with the concepts herein may be designed with minimum order while satisfying the design targets, including adding peak error constraints to the target frequency bands. Implementation of compensation filters designed according to embodiments herein use only shifters and adders without multipliers, thereby providing for reduced power consumption and hardware resource requirements as compared to other decimator implementations.

Figure 6:
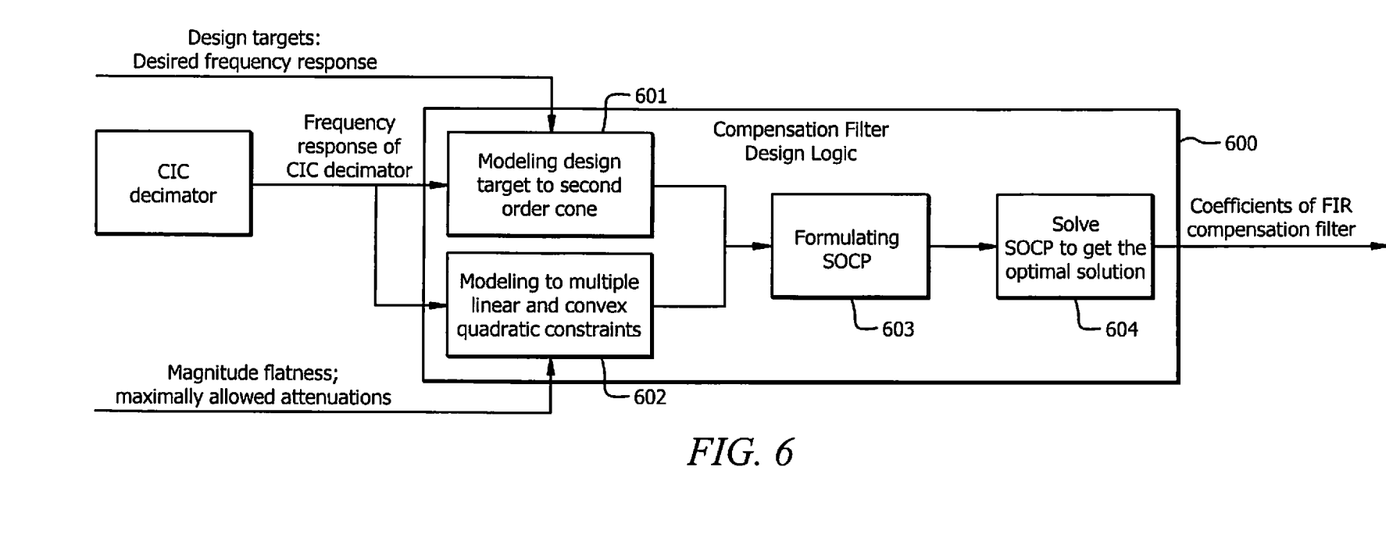
FIG. 6 shows compensation filter design logic of embodiments of the present invention.
Figure 9:
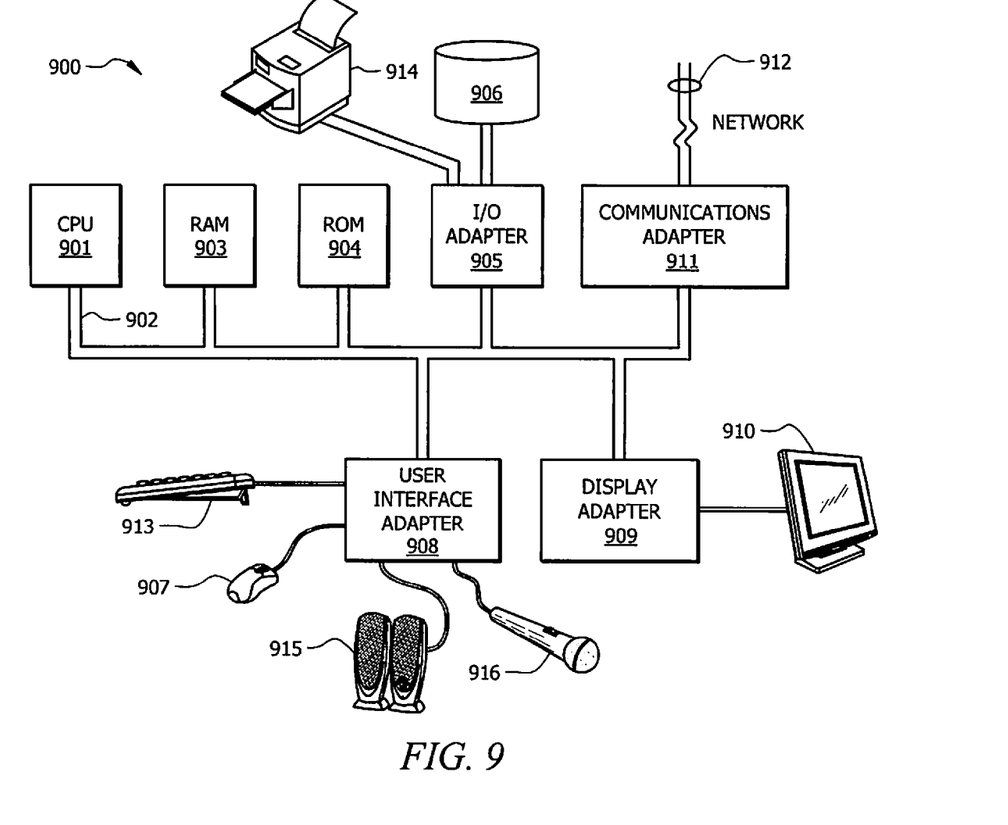
FIG. 9 shows a computer system adapted for use according to embodiments of the present invention.

FIG. 9 illustrates computer system 900 adapted for use according to an embodiment of the present invention, such as by implementing the functions of compensation filter design logic 600 of FIG. 6 in logic circuits thereof. Computer system 900 of the illustrated embodiment includes central processing unit (CPU) 901 coupled to system bus 902. CPU 901 may be any general purpose CPU, such as a processor from the CORE or PENTIUM families of processors available from Intel Corporation or a processor from the POWERPC family of processors available from the AIM alliance (Apple Inc., International Business Machines Corporation, and Motorola Inc.). However, the present invention is not restricted by the architecture of CPU 901 as long as CPU 901 supports the inventive operations as described herein.

Bus 902 of the illustrated embodiment is coupled to random access memory (RAM) 903, such as may comprise SRAM, DRAM, SDRAM, flash memory, and/or the like. Read only memory (ROM) 904, such as may comprise PROM, EPROM, EEPROM, and/or the like, is also coupled to bus 902 of the illustrated embodiment. RAM 903 and ROM 904 hold user and system data and programs as is well known in the art. Bus 902 is also coupled to input/output (I/O) controller 905, communications adapter 911, user interface adapter 908, and display adapter 909.

I/O controller 905 connects to storage device 906, such as may comprise one or more of a hard disk, an optical disk (e.g., compact disk (CD) or digital versatile disk (DVD)), a floppy disk, and a tape, to the computer system. I/O controller 905 of the illustrated embodiment is also connected to printer 914, which allows the system to print information such as documents, photographs, etc. Such a printer may be a traditional printer (e.g. dot matrix, laser, thermal, inkjet, etc.), a fax machine, a copy machine, and/or the like.

Communications adapter 911 is adapted to couple computer system 900 to network 912 to provide communications to and/or from external systems, devices, networks, etc. Network 912 may comprise the public switched telephone network (PSTN), a local area network (LAN), a metropolitan area network (MAN), a wide area network (WAN), an extranet, an intranet, the Internet, a cellular network, a cable transmission network, and/or the like.

User interface adapter 908 of the illustrated embodiment couples various user input devices to the computer system. For example, keyboard 913, pointing device 907, and microphone 916 may be coupled through user interface adapter to accept various forms of user input. Similarly, speakers 915 may be coupled through user interface adapter to provide user interface output.

The display adapter 909 provides an interface to display 910. Accordingly, CPU 901 may control display of various information, including text, graphics, and images upon display 910 through display adapter 909. Display 910 may comprise a cathode ray tube (CRT) display, a plasma display, a liquid crystal display (LCD), a projector, and/or the like. Although not expressly shown in the illustrated embodiment, display 910 may provide for input of data as well as output of data. For example, display 910 may comprise a touch screen display according to embodiments of the invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for designing a decimator compensation filter, the method comprising:

using, by a processor-based system, convex optimization to determine an approximation error representation for the decimator;

using, by the processor-based system, convex optimization to determine a peak stopband error constraint adapted for applying to the approximation error representation;

using, by the processor-based system, convex optimization to determine a peak passband ripple constraint adapted for applying to the approximation error representation;

combining, by the processor-based system, the approximation error representation, the peak stopband error constraint, and the peak passband ripple constraint to provide a constrained approximation error representation; and solving, by the processor-based system, the constrained approximation error representation for design coefficients of the compensation filter.

2. The method of claim 1, wherein the compensation filter comprises a Finite Impulse Response (FIR) filter.

3. The method of claim 2, wherein the decimator comprises a Cascaded-Integrator-Comb (CIC) decimator, and wherein the CIC decimator includes a CIC filter and the compensation filter.

4. The method of claim 3, wherein the using convex optimization to determine an approximation error representation for the decimator comprises:

discretizing, by the processor-based system, a frequency variable ($\omega$) over a set of frequencies ($\{\omega_i, 1 \leq i \leq K1\}$) of a passband frequency ($\omega_p$) and a stopband frequency ($\omega_s$);

calculating, by the processor-based system, a frequency response of the CIC filter over the discretized frequencies ($\{\omega_i, 1 \leq i \leq K1\}$); and formulating, by the processor-based system, an approximation error in minimax or Least Squares (LS) criteria as Second-Order Cone Programming (SOCP) over the discretized frequencies ($\{\omega_i, 1 \leq i \leq K1\}$).

5. The method of claim 4, wherein the formulating the approximation error SOCP in minimax or Least Squares (LS) criteria comprises:

calculating, by the processor-based system, a target frequency response ($H_d(\omega)$) at the discretized frequencies ($\{\omega_i, 1 \leq i \leq K1\}$);

calculating, by the processor-based system, a frequency response of the CIC filter ($H_{CIC}(\omega)$) at the discretized frequencies ($\{\omega_i, 1 \leq i \leq K1\}$);

calculating, by the processor-based system, a frequency response of the compensation filter ($H_{Comp}(\omega)$) at the discretized frequencies ($\{\omega_i, 1 \leq i \leq K1\}$);

calculating, by the processor-based system, the frequency response of the compensated CIC decimator ($H_S(\omega)$)) based on the frequency response of the CIC filter ($H_{CIC}(\omega)$) and the frequency response of the compensation filter ($H_{Comp}(\omega)$); and calculating, by the processor-based system, the approximation error ($e(\omega)$) between the frequency response of the compensated CIC decimator ($H_S(\omega)$) and the target frequency response ($H_d(\omega)$) at the discretized frequencies ($\{\omega_i, 1 \le i \le K1\}$).

6. The method of claim 5, wherein the formulating the approximation error SOCP in minimax or Least Squares (LS) criteria further comprises:
   formulating, by the processor-based system, minimization of a maximum estimation error to a set of second-order cones according to $$\min_x c^T x$$

at the discretized frequencies ($\{\omega_i, 1 \le i \le K1\}$).

7. The method of claim 5, wherein the formulating the approximation error SOCP in minimax or Least Squares (LS) criteria further comprises:
   formulating, by the processor-based system, minimization of integrated least square estimation error in LS criteria over the discretized frequencies ($\{\omega_i, 1 \le i \le K1\}$) to one or more second-order cones according to $$\min_x c^T x.$$

8. The method of claim 3, wherein the using convex optimization to determine a peak stopband error constraint adapted for applying to the approximation error representation comprises:
   discretizing, by the processor-based system, a frequency variable ($\omega$) over a set of frequencies ($\{\omega_i, 1 \le i \le K1\}$) of a passband frequency ($\omega_p$) and a stopband frequency ($\omega_s$);
   calculating, by the processor-based system, a frequency response of the CIC filter over the discretized frequencies ($\{\omega_i, 1 \le i \le K1\}$); and
   formulating, by the processor-based system, the peak stopband error ($\hat{\delta}_l$) to a set of second-order cones of SOCP over a set of target sub-bands in the stopband frequency ($\omega_s$).

9. The method of claim 8, wherein the formulating the peak stopband error ($\hat{\delta}_l$) to a set of second-order cones comprises:
   calculating, by the processor-based system, a target frequency response ($H_d(\omega)$) at the discretized frequencies ($\{\omega_i, 1 \le i \le K1\}$);
   calculating, by the processor-based system, a frequency response of the CIC filter ($H_{CIC}(\omega)$) at the discretized frequencies ($\{\omega_i, 1 \le i \le K1\}$);
   calculating, by the processor-based system, a frequency response of the compensation filter ($H_{Comp}(\omega)$) at the discretized frequencies ($\{\omega_i, 1 \le i \le K1\}$);
   calculating, by the processor-based system, the frequency response of the CIC filter ($H_{CIC}(\omega)$) combined with the frequency response of the compensation filter ($H_{Comp}(\omega)$) at the discretized frequencies ($\{\omega_i, 1 \le i \le K1\}$); and
   imposing, by the processor-based system, the peak stopband error ($\hat{\delta}_l$) for each of l target sub-bands in the stopband frequency ($\omega_s$) to formulate the set of second-order cones.

10. The method of claim 3, wherein the using convex optimization to determine a peak passband ripple constraint adapted for applying to the approximation error representation comprises:
    discretizing, by the processor-based system, a frequency variable ($\omega$) over a set of frequencies ($\{\omega_i, 1 \le i \le K1\}$) of a passband frequency ($\omega_p$) and a stopband frequency ($\omega_s$);
    calculating, by the processor-based system, a frequency response of the CIC filter over the discretized frequencies ($\{\omega_i, 1 \le i \le K1\}$); and
    formulating, by the processor-based system, the peak passband ripple ($\hat{\delta}_p$) to a set of second-order cones of SOCP over a set of target sub-bands in the passband frequency ($\omega_p$).

11. The method of claim 10, wherein the formulating, by the processor-based system, the peak passband ripple ($\hat{\delta}_p$) to a set of second-order cones comprises:
    calculating, by the processor-based system, a target frequency response ($H_d(\omega)$) at the discretized frequencies ($\{\omega_i, 1 \le i \le K1\}$);
    calculating, by the processor-based system, a frequency response of the CIC filter ($H_{CIC}(\omega)$) at the discretized frequencies ($\{\omega_i, 1 \le i \le K1\}$);
    calculating, by the processor-based system, a frequency response of the compensation filter ($H_{Comp}(\omega)$) at the discretized frequencies ($\{\omega_i, 1 \le i \le K1\}$);
    calculating, by the processor-based system, the frequency response of the CIC filter ($H_{CIC}(\omega)$) combined with the frequency response of the compensation filter ($H_{Comp}(\omega)$) at the discretized frequencies ($\{\omega_i, 1 \le i \le K1\}$); and
    imposing, by the processor-based system, the peak passband ripple ($\hat{\delta}_p$) for each of p target sub-bands in the passband frequency ($\omega_s$) to formulate the set of second-order cones.

12. The method of claim 1, wherein the approximation error representation comprises a Second-Order Cone Programming (SOCP) representation, wherein the peak stopband error constraint comprises a set of second-order cones of SOCP, and wherein the peak passband ripple constraint comprises a set of second-order cones of SOCP.

13. A method for designing a compensation filter for a Cascaded-Integrator-Comb (CIC) decimator, the CIC decimator including a CIC filter, the method comprising:
    receiving, at a processor-based system, specification information for the CIC decimator, the specification information including an order (L) of the CIC filter, a differential delay (M) of the CIC filter, a decimation factor (R) of the CIC decimator, a passband frequency ($\omega_p$) of the CIC decimator, a stopband frequency ($\omega_s$) of the CIC decimator, peak passband ripple ($\hat{\delta}_p$) of the CIC decimator, and a peak stopband error ($\hat{\delta}_l$) of the CIC decimator;
    discretizing, by the processor-based system, a frequency variable ($\omega$) over a set of frequencies ($\{\omega_i, 1 \le i \le K1\}$) of the passband frequency ($\omega_p$) and the stopband frequency ($\omega_s$);
    calculating, by the processor-based system, a frequency response of the CIC filter over the discretized frequencies ($\{\omega_i, 1 \le i \le K1\}$);
    formulating, by the processor-based system, an approximation error in minimax or Least Squares (LS) criteria as Second-Order Cone Programming (SOCP) over the discretized frequencies ($\{\omega_i, 1 \le i \le K1\}$);
    formulating, by the processor-based system, the peak stopband error ($\hat{\delta}_l$) to a set of second-order cones of SOCP over a set of target sub-bands in the stopband frequency ($\omega_s$);

formulating, by the processor-based system, the peak passband ripple ($\hat{\delta}_p$) to a set of second-order cones of SOCP over a set of target sub-bands in the passband frequency ($\omega_p$)

adding, by the processor-based system, the set of second-order cones of the peak stopband error and the set of second-order cones of the peak passband ripple to the approximation error SOCP to provide a constrained approximation error SOCP for the compensation filter; and solving, by the processor-based system, the constrained approximation error SOCP for design coefficients of the compensation filter.

14. The method of claim 13, wherein the formulating the approximation error SOCP in minimax or Least Squares (LS) criteria comprises:

calculating, by the processor-based system, a target frequency response ($H_d(\omega)$) at the discretized frequencies ($\{\omega_i, 1 \leq i \leq K1\}$);

calculating, by the processor-based system, a frequency response of the CIC filter ($H_{CIC}(\omega)$) at the discretized frequencies ($\{\omega_i, 1 \leq i \leq K1\}$);

calculating, by the processor-based system, a frequency response of the compensation filter ($H_{Comp}(\omega)$) at the discretized frequencies ($\{\omega_i, 1 \leq i \leq K1\}$);

calculating, by the processor-based system, the frequency response of the compensated CIC decimator ($H_S(\omega)$) based on the frequency response of the CIC filter ($H_{CIC}(\omega)$) and the frequency response of the compensation filter ($H_{Comp}(\omega)$); and calculating, by the processor-based system, the approximation error ($e(\omega)$) between the frequency response of the compensated CIC decimator ($H_S(\omega)$) and the target frequency response ($H_d(\omega)$) at the discretized frequencies ($\{\omega_i, 1 \leq i \leq K1\}$).

15. The method of claim 14, wherein the formulating the approximation error SOCP in minimax or Least Squares (LS) criteria further comprises:

formulating, by the processor-based system, minimization of a maximum estimation error to a set of second-order cones according to $$\min_x c^T x$$

at the discretized frequencies ($\{\omega_i, 1 \leq i \leq K1\}$).

16. The method of claim 14, wherein the formulating the approximation error SOCP in minimax or Least Squares (LS) criteria further comprises:

formulating, by the processor-based system, minimization of integrated least square estimation error in LS criteria over the discretized frequencies ($\{\omega_i, 1 \leq i \leq K1\}$) to one or more second-order cones according to $$\min_x c^T x.$$

17. The method of claim 13, wherein the formulating the peak stopband error ($\hat{\delta}_l$) to a set of second-order cones comprises:

calculating, by the processor-based system, a target frequency response ($H_d(\omega)$) at the discretized frequencies ($\{\omega_i, 1 \leq i \leq K1\}$);

calculating, by the processor-based system, a frequency response of the CIC filter ($H_{CIC}(\omega)$) at the discretized frequencies ($\{\omega_i, 1 \leq i \leq K1\}$);

calculating, by the processor-based system, a frequency response of the compensation filter ($H_{Comp}(\omega)$) at the discretized frequencies ($\{\omega_i, 1 \leq i \leq K1\}$);

calculating, by the processor-based system, the frequency response of the CIC filter ($H_{CIC}(\omega)$) combined with the frequency response of the compensation filter ($H_{Comp}(\omega)$) at the discretized frequencies ($\{\omega_i, 1 \leq i \leq K1\}$); and imposing, by the processor-based system, the peak stopband error ($\hat{\delta}_l$) for each of i target sub-bands in the stopband frequency ($\omega_s$) to formulate the set of second-order cones.

18. The method of claim 13, wherein the formulating, by the processor-based system, the peak passband ripple ($\hat{\delta}_p$) to a set of second-order cones comprises:

calculating, by the processor-based system, a target frequency response ($H_d(\omega)$) at the discretized frequencies ($\{\omega_i, 1 \leq i \leq K1\}$);

calculating, by the processor-based system, a frequency response of the CIC filter ($H_{CIC}(\omega)$) at the discretized frequencies ($\{\omega_i, 1 \leq i \leq K1\}$);

calculating, by the processor-based system, a frequency response of the compensation filter ($H_{Comp}(\omega)$) at the discretized frequencies ($\{\omega_i, 1 \leq i \leq K1\}$);

calculating, by the processor-based system, the frequency response of the CIC filter ($H_{CIC}(\omega)$) combined with the frequency response of the compensation filter ($H_{Comp}(\omega)$) at the discretized frequencies ($\{\omega_i, 1 \leq i \leq K1\}$); and imposing, by the processor-based system, the peak passband ripple ($\hat{\delta}_p$) for each of p target sub-bands in the passband frequency ($\omega_s$) to formulate the set of second-order cones.

19. A computer program product for designing a compensation filter for a Cascaded-Integrator-Comb (CIC) decimator, the CIC decimator including a CIC filter, the computer program product comprising:

a non-transitory computer-readable medium having program code recorded thereon, the program code including:

code to receive specification information for the CIC decimator, the specification information including an order (L) of the CIC filter, a differential delay (M) of the CIC filter, a decimation factor (R) of the CIC decimator, a passband frequency ($\omega_p$) of the CIC decimator, a stopband frequency ($\omega_s$) of the CIC decimator, peak passband ripple ($\hat{\delta}_p$) of the CIC decimator, and a peak stopband error ($\hat{\delta}_l$) of the CIC decimator;

code to discretize a frequency variable ($\omega$) over a set of frequencies ($\{\omega_i, 1 \leq i \leq K1\}$) of the passband frequency ($\omega_p$) and the stopband frequency ($\omega_s$);

code to calculate a frequency response of the CIC filter over the discretized frequencies ($\{\omega_i, 1 \leq i \leq K1\}$);

code to formulate an approximation error in minimax or Least Squares (LS) criteria as Second-Order Cone Programming (SOCP) over the discretized frequencies ($\{\omega_i, 1 \leq i \leq K1\}$);

code to formulate the peak stopband error ($\hat{\delta}_l$) to a set of second-order cones of SOCP over a set of target sub-bands in the stopband frequency ($\omega_s$);

code to formulate the peak passband ripple ($\hat{\delta}_p$) to a set of second-order cones of SOCP over a set of target sub-hands in the passband frequency ($\omega_p$)

code to add the set of second-order cones of the peak stopband error and the set of second-order cones of the peak passband ripple to the approximation error SOCP to provide a constrained approximation error SOCP for the compensation filter; and code to solve the constrained approximation error SOCP for design coefficients of the compensation filter.

20. The computer program product of claim 19, wherein the code to formulate the approximation error SOCP in minimax or Least Squares (LS) criteria comprises:

code to calculate a target frequency response ($H_d(\omega)$) at the discretized frequencies ($\{\omega_i, 1 \le i \le K1\}$);

code to calculate a frequency response of the CIC filter ($H_{CIC}(\omega)$) at the discretized frequencies ($\{\omega_i, 1 \le i \le K1\}$);

code to calculate a frequency response of the compensation filter ($H_{Comp}(\omega)$) at the discretized frequencies ($\{\omega_i, 1 \le i \le K1\}$);

code to calculate the frequency response of the compensated CIC decimator ($H_s(\omega)$) based on the frequency response of the CIC filter ($H_{CIC}(\omega)$) and the frequency response of the compensation filter ($H_{Comp}(\omega)$); and code to calculate the approximation error ($e(\omega)$) between the frequency response of the compensated CIC decimator ($H_s(\omega)$) and the target frequency response ($H_d(\omega)$) at the discretized frequencies ($\{\omega_i, 1 \le i \le K1\}$).

21. The computer program product of claim 20, wherein the code to formulate the approximation error SOCP in minimax or Least Squares (LS) criteria further comprises:

code to formulate minimization of a maximum estimation error to a set of second-order cones according to $$\min_x c^T x$$

at the discretized frequencies ($\{\omega_i, 1 \le i \le K1\}$).

22. The computer program product of claim 20, wherein the code to formulate the approximation error SOCP in minimax or Least Squares (LS) criteria further comprises:

code to formulate minimization of integrated least square estimation error in LS criteria over the discretized frequencies ($\{\omega_i, 1 \le i \le K1\}$) to one or more second-order cones according to $$\min_x c^T x.$$

23. The computer program product of claim 19, wherein the code to formulate the peak stopband error ($\hat{\delta}_l$) to a set of second-order cones comprises:

code to calculate a target frequency response ($H_d(\omega)$) at the discretized frequencies ($\{\omega_i, 1 \le i \le K1\}$);

code to calculate a frequency response of the CIC filter ($H_{CIC}(\omega)$) at the discretized frequencies ($\{\omega_i, 1 \le i \le K1\}$);

code to calculate a frequency response of the compensation filter ($H_{Comp}(\omega)$) at the discretized frequencies ($\{\omega_i, 1 \le i \le K1\}$);

code to calculate the frequency response of the CIC filter ($H_{CIC}(\omega)$) combined with the frequency response of the compensation filter ($H_{Comp}(\omega)$) at the discretized frequencies ($\{\omega_i, 1 \le i \le K1\}$); and code to impose the peak stopband error ($\hat{\delta}_l$) for each of l target sub-bands in the stopband frequency ($\omega_s$) to formulate the set of second-order cones.

24. The computer program product of claim 19, wherein the code to formulate the peak passband ripple ($\hat{\delta}_p$) to a set of second-order cones comprises:

code to calculate a target frequency response ($H_d(\omega)$) at the discretized frequencies ($\{\omega_i, 1 \le i \le K1\}$);

code to calculate a frequency response of the CIC filter ($H_{CIC}(\omega)$) at the discretized frequencies ($\{\omega_i, 1 \le i \le K1\}$);

code to calculate a frequency response of the compensation filter ($H_{Comp}(\omega)$) at the discretized frequencies ($\{\omega_i, 1 \le i \le K1\}$);

code to calculate the frequency response of the CIC filter ($H_{CIC}(\omega)$) combined with the frequency response of the compensation filter ($H_{Comp}(\omega)$) at the discretized frequencies ($\{\omega_i, 1 \le i \le K1\}$); and code to impose the peak passband ripple ($\hat{\delta}_p$) for each of p target sub-bands in the passband frequency ($\omega_s$) to formulate the set of second-order cones.

* * * * *